United States Patent
Lee et al.

(10) Patent No.: US 9,746,783 B2
(45) Date of Patent: Aug. 29, 2017

(54) METHOD FOR PREVENTING PHOTORESIST CORNER ROUNDING EFFECTS

(71) Applicant: Taiwan Semiconductor Manufacturing Co., Ltd., Hsin-Chu (TW)

(72) Inventors: Liang-Yao Lee, Taoyuan (TW); Jyh-Kang Ting, Baoshan Township (TW); Tsung-Chieh Tsai, Chu-Bei (TW); Juing-Yi Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 502 days.

(21) Appl. No.: 13/967,477

(22) Filed: Aug. 15, 2013

(65) Prior Publication Data

US 2015/0050810 A1 Feb. 19, 2015

(51) Int. Cl.
*H01L 21/308* (2006.01)
*G03F 7/20* (2006.01)
*G03F 1/36* (2012.01)

(52) U.S. Cl.
CPC ............ *G03F 7/70441* (2013.01); *G03F 1/36* (2013.01); *G03F 7/70283* (2013.01)

(58) Field of Classification Search
CPC ..... G03F 1/36; G03F 7/70441; G03F 7/70433
See application file for complete search history.

(56) References Cited

U.S. PATENT DOCUMENTS

| 6,316,340 | B1 | 11/2001 | Hwang et al. | |
| 2005/0064728 | A1 * | 3/2005 | Yang | 438/784 |
| 2005/0250021 | A1 * | 11/2005 | Chen et al. | 430/5 |

* cited by examiner

*Primary Examiner* — Daborah Chacko Davis
(74) *Attorney, Agent, or Firm* — Eschweiler & Potashnik, LLC

(57) ABSTRACT

A method for ameliorating corner rounding effects in a photolithographic process is provided. A semiconductor workpiece having an active device region is provided, and a photoresist layer is formed over the semiconductor workpiece. A mask is provided for patterning for the photoresist layer, wherein the mask comprises pattern having a sharp corner associated with the active device region. The sharp corner is separated from the active device region by a first distance in a first direction and a second distance in a second direction, wherein the first distance meets a minimum criteria for the photolithographic process, and wherein the second distance is greater than the first distance. The photoresist layer is then exposed to a radiation source, and the radiation source patterns the photoresist layer through the mask, defining an exposure region on the semiconductor workpiece having a rounded corner associated with the sharp corner. Accordingly, the second distance generally prevents the rounded corner of the exposure region from overlapping the active device region.

20 Claims, 3 Drawing Sheets

METHOD FOR PREVENTING PHOTORESIST CORNER ROUNDING EFFECTS

BACKGROUND

In semiconductor manufacturing, a semiconductor workpiece or wafer often undergoes many processing steps or stages before a completed die is formed. For example, lithographic processes are performed on the semiconductor wafer using a mask and photoresist to transfer a particular design or layout onto the wafer. Design Rules (DRs) are a series of parameters provided by semiconductor manufacturers that enable a designer to verify the correctness of a mask or mask set. Design rules are often specific to a particular semiconductor manufacturing process. A design rule set specifies certain geometric and connectivity restrictions to, among other things, ensure sufficient margins to account for variability in semiconductor manufacturing processes, so as to ensure that most of the resultant components work as designed.

As integrated circuits become smaller, they are designed with ever-decreasing feature dimensions. Accordingly, lithographic processes performed on the semiconductor wafer play an important role in the continued reduction in feature dimensions. For example, the fabrication of integrated circuits having line widths smaller than 0.18 µm largely depends on the continued development of photolithography. In order to reduce the size of semiconductor devices, the resolution of a photomask in photolithographic processing needs to be increased. Developments such as optical proximity correction (OPC) and phase shift masks (PSMs) have been introduced in order to continue the reduction in feature dimensions.

Conventionally, optical proximity correction is one of the primary methods in attempting to maintain critical dimensions which can deviate due to proximity effects. Proximity effects can occur during lithographic processing when a beam of light passes through a photomask, wherein the beam of light projects through a pattern on the photomask to expose a photoresist on a surface of the semiconductor wafer to the pattern. During the exposure of the wafer to the beam of light, light rays may be diffracted by the photomask such that a portion of the light rays diverge. Further, some of the light passing into the photoresist can be reflected by the semiconductor substrate of the workpiece, thus causing interference. As such, a portion of the photoresist layer may be repeatedly exposed to the beam of light, thus leading to undesirable variation in photoresist exposure.

One such undesirable variation is an effect called corner rounding, where substantially square corners of a pattern are rounded in the resulting exposed photoresist. FIG. 1A illustrates a top view of a conventional photomask 100 with a pattern 105 for manufacturing a semiconductor circuit. FIG. 1B illustrates a top view of the resulting pattern 110 on a photoresist 115 on a semiconductor wafer 120 after photolithographic processing utilizing the photomask 100 of in FIG. 1A.

After being exposed to light during the photolithography process, a corner 125 of the pattern 105 of FIG. 1A yields a rounded corner 130 of FIG. 1B on the resulting pattern 110 of the photoresist 115, wherein the rounded corner is caused by the above-mentioned proximity effects. Such a rounded corner 125 can deleteriously encroach into a device region 135, as illustrated in region 140, wherein active devices are formed. To prevent such corner rounding from impacting the device region 135, a distance 145 between the active region 135 and the pattern 110 of FIG. 1A is uniformly increased, thus yielding a modified pattern 150 (illustrated in dashed line) of FIG. 1C having a modified distance 155 between the device region 135 and the modified pattern. As seen in FIG. 1C, it is conventional for the modified distance 155 to be uniformly increased in both the x-direction and y-direction, wherein the active region 135 is equally separated from the modified pattern.

However, as device dimensions continue to shrink, lines widths become increasingly narrow, where there is limited area around the device region 135 for forming the modified pattern 150 while meeting minimum design rule criteria.

BRIEF SUMMARY

The following presents an overview of the disclosure in order to provide a basic understanding of one or more aspects of the disclosure. This is not an extensive overview of the disclosure, and is neither intended to identify key or critical elements of the invention, nor to delineate the scope thereof. Rather, the primary purpose of the summary is to present some concepts of the disclosure in a simplified form as a prelude to the more detailed description that is presented later.

According to various embodiments, the present disclosure relates to a method for ameliorating photoresist corner rounding effects in an integrated circuit layout. The method, for example, comprises providing a semiconductor workpiece having an active device region defined thereon. A photoresist layer is formed over the semiconductor workpiece, and a mask is provided for patterning for the photoresist layer.

The mask, for example, comprises a mask pattern having a sharp corner associated with the active device region. The sharp corner is separated from the active device region by a first distance in a first direction and a second distance in a second direction. The first direction, for example, is generally perpendicular to the second direction. The first distance, for example, meets a minimum criteria for the photolithographic process, and the second distance is greater than the first distance. The minimum criteria for the photolithographic process, for example, comprises one or more of a design rule minimum and a minimum resolution width associated with the photolithographic process. According to yet another example, the first distance in the first direction can be associated with another active device region, wherein surface area on the semiconductor workpiece is advantageously minimized.

The photoresist layer can comprise a positive photoresist layer or a negative photoresist layer. In another example, the photoresist layer is exposed to a radiation source, wherein the radiation source patterns the photoresist layer through the mask. The radiation source, for example, comprises an extreme ultraviolet light source. Accordingly, an exposure region on the semiconductor workpiece is defined having a rounded corner associated with the sharp corner of the mask, wherein the second distance generally prevents the rounded corner of the exposure region from overlapping the active device region. In another example, the method further comprises forming an active device in the active device region, wherein the rounded corner does not interfere with the active device.

DETAILED DESCRIPTION

Figure 1A:
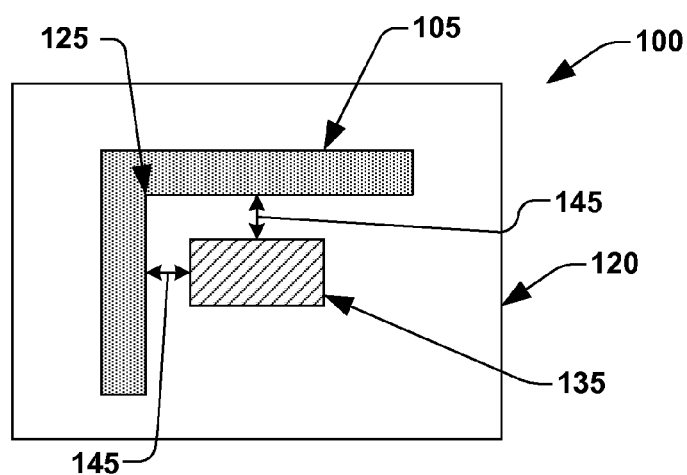
FIG. 1A illustrates a plan view of a conventional photomask having a sharp corner.
Figure 1B:
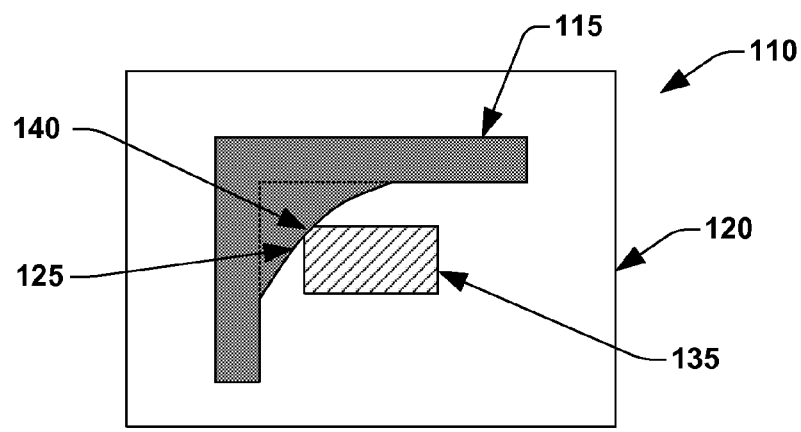
FIG. 1B illustrates a plan view of an exposure of a photoresist using the conventional photomask of FIG. 1A, wherein overlap of an active region is evidenced.
Figure 1C:
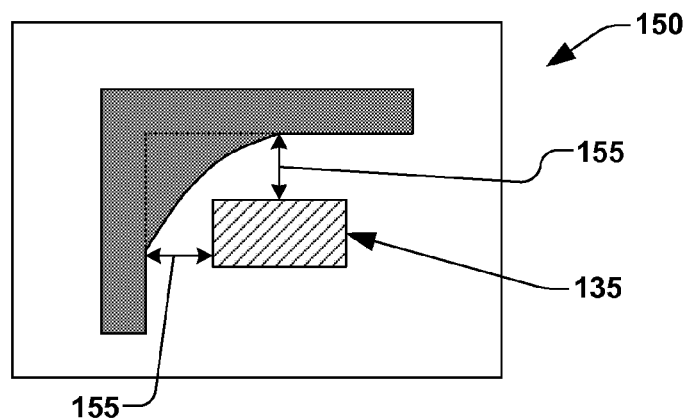
FIG. 1C illustrates a plan view of an exposure of a photoresist using a modified conventional photomask having uniform spacing, wherein overlap of an active region is prevented.

The present disclosure provides a method for ameliorating corner rounding effects in a photolithographic process while preserving surface area on a semiconductor workpiece. Accordingly, the description is made with reference to the drawings, in which like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Figure 2:
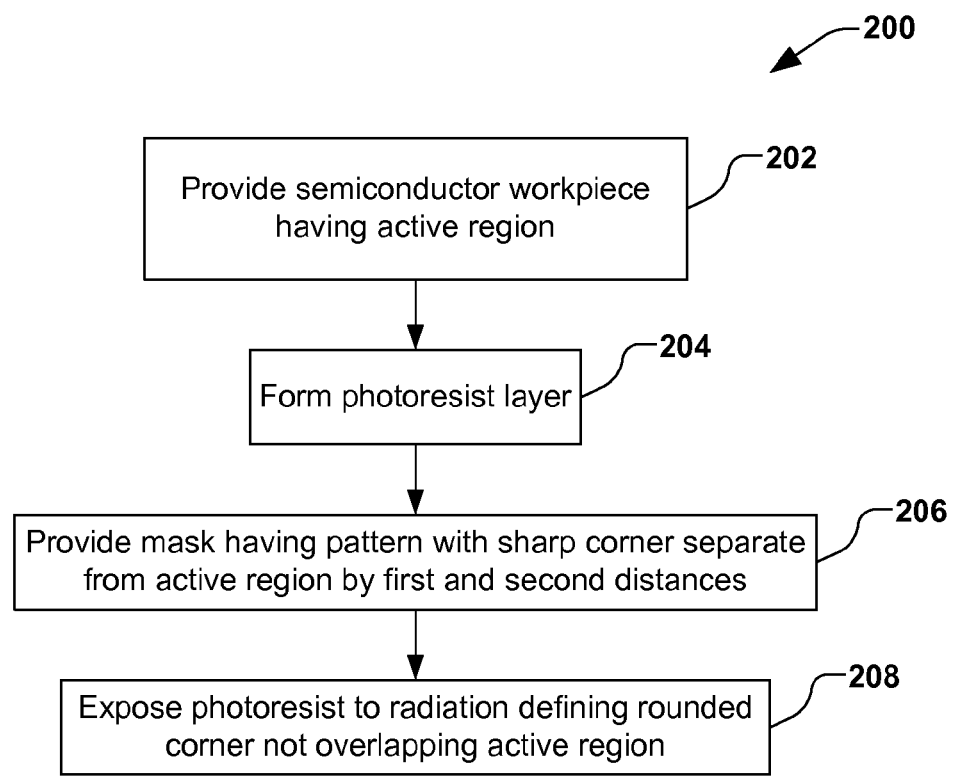
FIG. 2 illustrates an exemplary methodology for ameliorating corner rounding effects in a photolithographic process while preserving surface area on a semiconductor workpiece.

Referring now to the Figures, FIG. 2 illustrates a method 200 for ameliorating corner rounding effects in a photolithographic process. In order to gain a better understanding of the disclosure, the method 200 of FIG. 2 will be further described with reference to FIGS. 3 and 4, wherein various details will be further appreciated.

Figure 3:
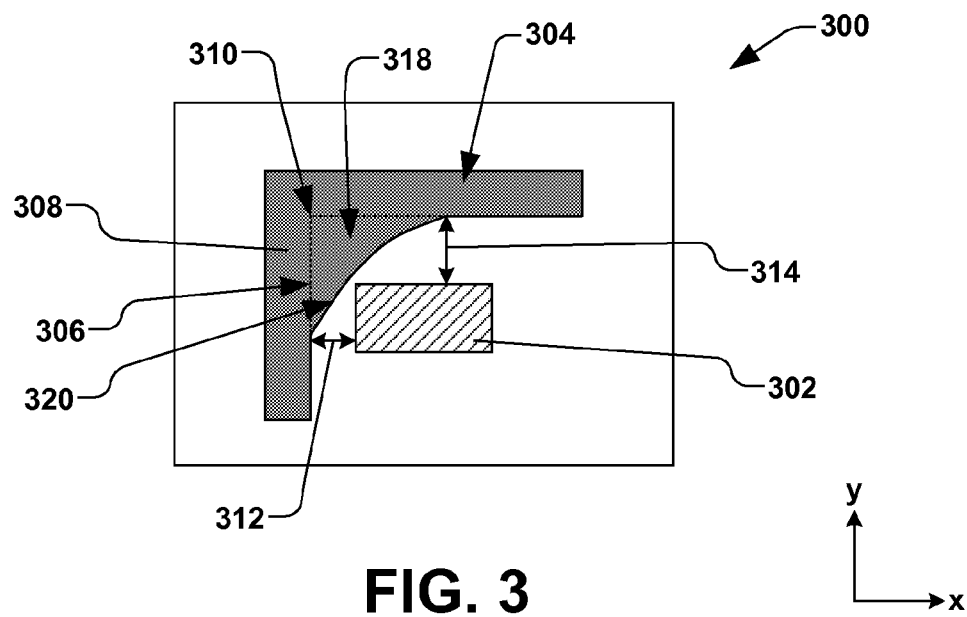
FIG. 3 illustrates a plan view of an exposure of a photoresist using a photomask having non-uniform spacing, wherein overlap of an active region is prevented.

In act 202 of the method 200 of FIG. 2, a semiconductor workpiece having an active device region defined thereon is provided. FIG. 3, for example, illustrates an exemplary semiconductor workpiece 300, such as a silicon wafer, wherein an active device region 302 is defined thereon. The active device region 302, for example, comprises (or will comprise after subsequent processing) one or more of semiconductor devices, conductive layers, and dielectric layers (not shown). The active device region 302, for example, can comprise various regions of a CMOS device, such as an N-type well region, a lightly doped drain (LDD) implant region, a source/drain implant region, and a P-type metal gate region.

In act 204 of FIG. 2, a photoresist layer is formed over the semiconductor workpiece. The photoresist layer, for example, comprises one of a positive photoresist and a negative photoresist. Referring again the semiconductor workpiece 300 of FIG. 3, the photoresist layer 304 is illustrated over the semiconductor workpiece.

In act 206 of FIG. 2, a mask is provided for patterning the photoresist layer (illustrated by dashed line 306 in FIG. 3). The mask 306 comprises a pattern 308 having a sharp corner 310 associated with the active device region 302. The sharp corner 310, for example, is separated from the active device region 302 by a first distance 312 in a first direction (e.g., the x-direction) and a second distance 314 in a second direction (e.g., the y-direction). In the present example, the first direction is generally perpendicular to the second direction.

In accordance with the present disclosure, the first distance 312 meets a minimum criteria for the photolithographic process, such as one or more of a design rule minimum and a minimum resolution width associated with the photolithographic process.

Also according to the present disclosure, the second distance 314 is greater than the first distance. As such, when the photoresist layer 304 is exposed to a radiation source (not shown) such as an extreme ultraviolet radiation source in act 208 of FIG. 2, the radiation source patterns the photoresist layer through the mask 306, therein defining an exposure region 318 on the semiconductor workpiece 300 having a rounded corner 320 associated with the sharp corner 310 of the mask. Accordingly, the second distance 314 being greater than the first distance 312 generally prevents the rounded corner 320 of the exposure region 318 from overlapping the active device region 302.

Figure 4:
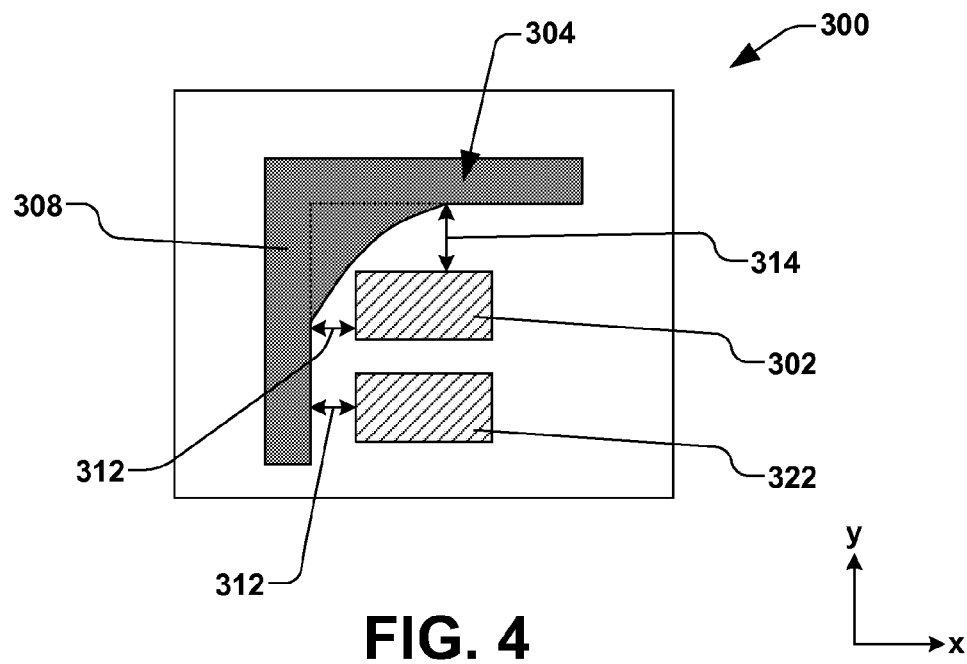
FIG. 4 illustrates a plan view of an exposure of a photoresist using a photomask having non-uniform spacing, wherein overlap of a plurality of active regions is prevented.

When compared with the conventional methodologies, the pattern 308 of the present disclosure has a significantly higher resolution, thus increasing an amount of available surface area on the semiconductor workpiece 300. For example, as illustrated in FIG. 4, the first distance 312 in the first direction can be further associated with another active device region 322, wherein surface area on the semiconductor workpiece 300 is optimized. Further, according to the present disclosure, one or more active devices can be formed in the active device region.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

While the method(s) provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method for ameliorating corner rounding effects in a photolithographic process, the method comprising:
    providing a semiconductor workpiece having an active device region defined thereon;
    forming a photoresist layer over the semiconductor workpiece;
    providing a mask for patterning the photoresist layer, wherein the mask comprises a pattern having a sharp inside corner associated with the active device region, and wherein the sharp inside corner is separated from the active device region by a first distance in a first direction and a second distance in a second direction, wherein the first distance meets one or more of a design rule minimum and a minimum resolution width associated with the photolithographic process, and wherein the second distance is greater than the first distance; and
    exposing the photoresist layer to a radiation source, wherein the radiation source patterns the photoresist layer through the mask, therein defining an exposure region on the semiconductor workpiece having a rounded corner associated with the sharp inside corner, and wherein the second distance generally prevents the rounded corner of the exposure region from overlapping the active device region.

2. The method of claim 1, wherein the first direction is generally perpendicular to the second direction.

3. The method of claim 1, wherein the photoresist layer comprises one of a positive photoresist layer and a negative photoresist layer.

4. The method of claim 1, wherein the radiation source comprises an extreme ultraviolet radiation source.

5. The method of claim 1, further comprising forming an active device in the active device region.

6. The method of claim 1, wherein the first distance in the first direction is further associated with another active device region, wherein surface area on the semiconductor workpiece is optimized.

7. The method of claim 1, wherein the first distance is at the one or more of the design rule minimum and minimum resolution width for the photolithographic process, and wherein providing the mask further comprises minimizing the second distance to generally prevent the rounded corner of the exposure region from overlapping the active device region, wherein minimizing the second distance is based on the first distance.

8. The method of claim 1, wherein the rounded corner of the exposure region would overlap the active device region if the second distance were to equal the first distance.

9. A method for ameliorating corner rounding effects in a photolithographic process, the method comprising:
    determining a mask pattern for patterning a photoresist layer on a semiconductor workpiece, wherein the mask pattern has a sharp inside corner associated with an active device region on the semiconductor workpiece, and wherein the sharp inside corner is separated from the active device region by a first distance in a first direction and a second distance in a second direction, wherein the first distance meets one or more of a design rule minimum and a minimum resolution width associated with the photolithographic process, and wherein the second distance is greater than the first distance;
    forming a mask having the mask pattern defined therein; and
    exposing the photoresist layer to a radiation source, wherein the radiation source patterns the photoresist layer through the mask, therein defining an exposure region on the semiconductor workpiece having a rounded corner associated with the sharp inside corner, and wherein the second distance generally prevents the rounded corner of the exposure region from overlapping the active device region.

10. The method of claim 9, wherein the first direction is generally perpendicular to the second direction.

11. The method of claim 9, wherein the photoresist layer comprises one of a positive photoresist layer and a negative photoresist layer.

12. The method of claim 9, wherein the radiation source comprises an extreme ultraviolet radiation source.

13. The method of claim 9, further comprising forming an active device in the active device region.

14. A method for ameliorating corner rounding effects in a photolithographic process, the method comprising:
    providing a mask having a mask pattern for patterning a photoresist layer on a semiconductor workpiece, wherein the mask pattern has a sharp inside corner associated with an active device region on the semiconductor workpiece, and wherein the sharp inside corner is separated from the active device region by a first distance in a first direction and a second distance in a second direction, wherein the first distance meets one or more of a design rule minimum and a minimum resolution width associated with the photolithographic process, and wherein the second distance is greater than the first distance; and
    exposing the photoresist layer to a radiation source, wherein the radiation source patterns the photoresist layer through the mask, therein defining an exposure region on the semiconductor workpiece having a rounded corner associated with the sharp inside corner, and wherein the second distance generally prevents the rounded corner of the exposure region from overlapping the active device region.

15. The method of claim 14, wherein the first direction is generally perpendicular to the second direction.

16. The method of claim 14, wherein the photoresist layer comprises one of a positive photoresist layer and a negative photoresist layer.

17. The method of claim 14, wherein the first distance in the first direction is further associated with another active device region, wherein surface area on the semiconductor workpiece is optimized.

18. The method of claim 17, wherein the active device region comprises one or more of a semiconductor device, a conductive layer, and a dielectric layer and wherein the another active device region comprises one or more of another semiconductor device, another conductive layer, and another dielectric layer.

19. The method of claim 14, wherein the active device region comprises one or more of a semiconductor device, a conductive layer, and a dielectric layer.

20. The method of claim 14, wherein the first distance in the first direction is further associated with another active device region, and wherein the another active device region comprises one or more of another semiconductor device, another conductive layer, and another dielectric layer, wherein surface area on the semiconductor workpiece is optimized.

* * * * *